(12) United States Patent
Nakai

(10) Patent No.: US 10,979,240 B2
(45) Date of Patent: Apr. 13, 2021

(54) SUBSTRATE WORK SYSTEM

(71) Applicant: FUJI CORPORATION, Chiryu (JP)

(72) Inventor: Kenji Nakai, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 13 days.

(21) Appl. No.: 16/468,579

(22) PCT Filed: Dec. 12, 2016

(86) PCT No.: PCT/JP2016/086842
§ 371 (c)(1),
(2) Date: Jun. 11, 2019

(87) PCT Pub. No.: WO2018/109792
PCT Pub. Date: Jun. 21, 2018

(65) Prior Publication Data
US 2020/0084059 A1 Mar. 12, 2020

(51) Int. Cl.
H04L 12/28 (2006.01)
H04L 12/24 (2006.01)
H04L 12/26 (2006.01)

(52) U.S. Cl.
CPC .......... *H04L 12/28* (2013.01); *H04L 41/0631* (2013.01); *H04L 43/0823* (2013.01)

(58) Field of Classification Search
CPC ..... H04L 43/0823; H04L 12/28; H04L 12/44; H04L 41/0631; H04L 12/24; H04L 12/26; H05K 13/00

(Continued)

(56) References Cited

U.S. PATENT DOCUMENTS 7,523,184 B2 * 4/2009 Kortright .............. H04L 41/082
　　　　　　　　　　　　　　　　　　　　　　　709/220
7,949,744 B2 * 5/2011 Kortright ............ H04L 41/0886
　　　　　　　　　　　　　　　　　　　　　　　709/223

(Continued)

FOREIGN PATENT DOCUMENTS

JP　　2000-172320 A　　6/2000
JP　　2002-271100 A　　9/2002

(Continued)

OTHER PUBLICATIONS

International Search Report dated Feb. 28, 2017 in PCT/JP2016/086842 filed Dec. 12, 2016.

*Primary Examiner* — Man U Phan
(74) *Attorney, Agent, or Firm* — Oblon, McClelland, Maier & Neustadt, L.L.P.

(57) ABSTRACT

A substrate work system is provided which can reduce the time taken to deal with a communication error by notifying information on the communication error. First confirmation processing section of mounting device determines a cause for a communication error in a communication line between two devices in response to an occurrence of a communication error in first network. Display device displays a result of the confirmation by first confirmation processing section in addition to a message informing that a communication error occurs in first network. As a result, an operator of substrate work system can confirm in which communication path or the like the communication error is possibly occurring in first network by checking the content displayed on display device.

7 Claims, 8 Drawing Sheets

(58) Field of Classification Search
USPC .......................................................... 370/252
See application file for complete search history.

(56) References Cited

U.S. PATENT DOCUMENTS

| | | | | |
|---|---|---|---|---|
| 9,077,611 | B2* | 7/2015 | Cordray | .............. H04L 41/0893 |
| 9,118,545 | B2* | 8/2015 | Suerbaum | ............ H04L 41/0663 |
| 9,525,739 | B2* | 12/2016 | Yamaguchi | ............ H04L 69/324 |
| 9,537,731 | B2* | 1/2017 | Link | ........................ H04L 41/12 |
| 9,621,420 | B2* | 4/2017 | Bradley | ................ H04L 41/147 |
| 10,686,675 | B2* | 6/2020 | Cordray | .............. H04L 41/0246 |
| 10,735,269 | B2* | 8/2020 | Wilson | ................. H04L 61/2007 |
| 2002/0057018 | A1 | 5/2002 | Branscomb et al. | |
| 2004/0062362 | A1* | 4/2004 | Matsuya | ............ H04B 10/1141 |
| | | | | 379/56.1 |
| 2020/0151414 | A1* | 5/2020 | Sugiyama | ............ H05K 13/087 |

FOREIGN PATENT DOCUMENTS

| | | | |
|---|---|---|---|
| JP | 2006-229512 A | 8/2006 | |
| JP | 2016-48507 A | 4/2016 | |
| JP | 2016-103675 A | 6/2016 | |

* cited by examiner

SUBSTRATE WORK SYSTEM

TECHNICAL FIELD

The present application relates to a technique for dealing with a communication error in a substrate work system.

BACKGROUND ART

For example, as a technique related to a FA (Factory Automation) network, there is a technique related to a communication error between a robot controller and a master unit (for example, Patent Literature 1). In this FA network, when multiple communication errors are detected during robot adjustment work, only a first communication error is made effective (and second and subsequent communication errors are discarded). As a result, the adjustment work is prevented from being suspended.

PATENT LITERATURE

Patent Literature 1: JP-A-2000-172320

BRIEF SUMMARY

Technical Problem

Incidentally, for example, in a substrate work system in which substrate work devices such as a printer, multiple mounting machines, and the like are coupled together to make up a production line, as the devices get sophisticated and complex, the configuration of a network also gets complex. In addition, there are various factors that trigger a communication error, and among them, a disconnection of a communication line, a setting error, a failure of network equipment, and the like are considered to cause such a communication error. Due to this, in the event that a communication error occurs, it becomes difficult for an operator to identify a cause therefor, causing a problem in that it takes some time for the operator to properly deal with the communication error.

The present disclosure has been made in view of such situations, and an object of the present disclosure is to provide a substrate work system that can reduce the time taken to properly deal with a communication error by notifying information on the communication error.

Solution to Problem

To achieve the object, the present description discloses a substrate work system including: multiple substrate work devices connected to each other via a network and configured to perform work on a substrate; a management device connected to the multiple substrate work devices via the network and configured to manage the multiple substrate work devices; a first confirmation processing section provided on at least one device out of the multiple substrate work devices and the management device and configured to determine a cause for a communication error in a communication path connecting together at least two devices out of the multiple substrate work devices and the management device in response to an occurrence of a communication error in the network; and a notification section configured to notify an occurrence of a communication error in the network and a result of confirmation by the first confirmation processing section.

Advantageous Effect

According to the disclosure, an operator or the like of the substrate work system can confirm in which communication path in the network connecting together the multiple substrate work devices and the management device the communication error is possibly occurring by checking the contents notified by the notification section.

DESCRIPTION OF EMBODIMENT

Hereinafter, an embodiment embodying a mode for carrying out the present disclosure will be described in detail by reference to drawings.

1. Configuration of Substrate Work System

Figure 1:
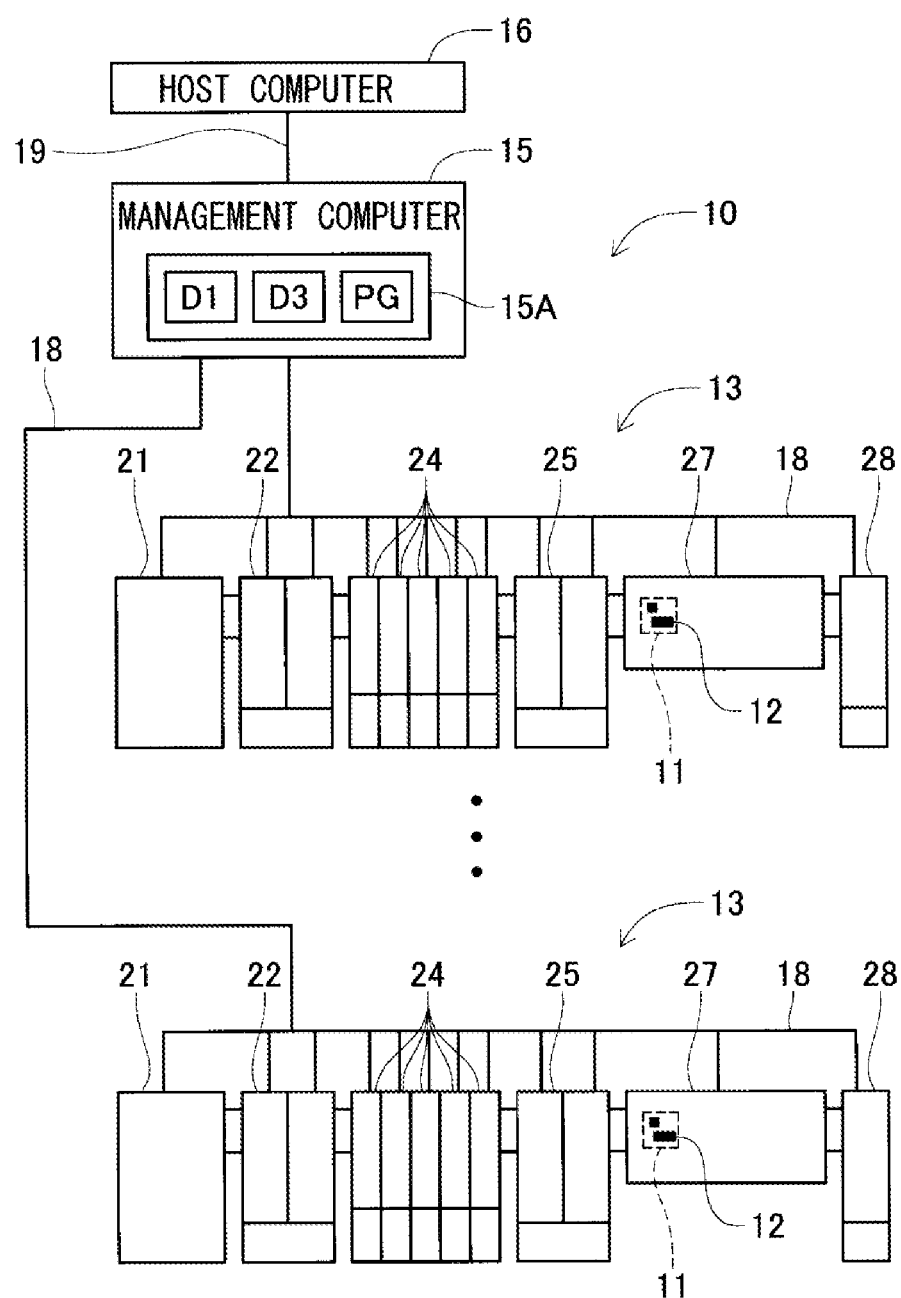
FIG. 1 A diagram illustrating the configuration of a substrate work system according to an embodiment.

FIG. 1 schematically illustrates the configuration of substrate work system 10 of this embodiment. Substrate work system 10 of this embodiment includes, for example, as illustrated in FIG. 1, multiple production lines 13 where electronic components 12 are mounted on substrates 11. In each of multiple production lines 13, for example, substrate feeder 21, printer 22, multiple mounting systems 24, mounting work result inspection machine 25, reflow furnace 27, and final inspection machine 28 are arranged sequentially side by side in that order from an upstream side of the projection line. Substrates 11 sequentially pass through those pieces of equipment, and eventually, electronic components 12 are mounted on substrates 11. Substrate work system 10 also includes management computer 15 configured to collectively control the individual pieces of equipment such as substrate feeder 21 and host computer 16 connected to management computer 15. The pieces of equipment constituting production line 13 described above are examples of substrate work devices of this patent application which are configured to perform work on substrates.

Printer 22 prints a predetermined pattern of solder on substrate 11 conveyed from substrate feeder 21 situated upstream of printer 22. Mounting system 24 mounts electronic component 12 on substrate 11 conveyed from printer 22. Mounting work result inspection machine 25 inspects whether electronic component 12 is mounted properly or improperly on substrate 11. Reflow furnace 27 heats substrate 11 determined to be accepted by mounting work result inspection machine 25. The solder printed on substrate 11 is heated to melt and is then cooled to solidify. As a result, electronic component 12 is joined to substrate 11. Final inspection machine 28 inspects the state of electronic component 12 joined onto substrate 11.

Management computer 15 is connected to substrate feeder 21 and the like via first network 18. Management computer 15 includes storage device 15A. Storage device 15A includes, for example, a hard disk, a non-volatile memory, and the like. Storage device 15A stores various pieces of information on multiple production lines 13, for example, information on a production plan regarding types and production volumes of substrates 11 to be produced on production lines 13, production programs for controlling operations of substrate feeder 21 and the like to produce those types of substrates 11. In addition, storage device 15A also stores management program PG for recording and managing a process of transmitting the production programs and the like to substrate feeder 21 and the like and transmission target information. Management computer 15 performs the function of transmitting the production programs and the like to substrate feeder 21 and the like of each production line 13 via first network 18 by executing management program PG using CPU 15E (refer to FIG. 2). For example, each mounting system 24 mounts electronic components 12 on substrate 11 in mounting positions set in the production program received thereby.

Host computer 16 is connected to management computer 15 via second network 19. The operator or the like of production lines 13 can change the production programs for transmission from management computer 15 to substrate feeders 21 and the like by operating input device 16A (refer to FIG. 2) of host computer 16. As a result, the operator or the like can change operation modes of mounting systems 24 based on the production programs.

2. Network Configuration

Figure 2:
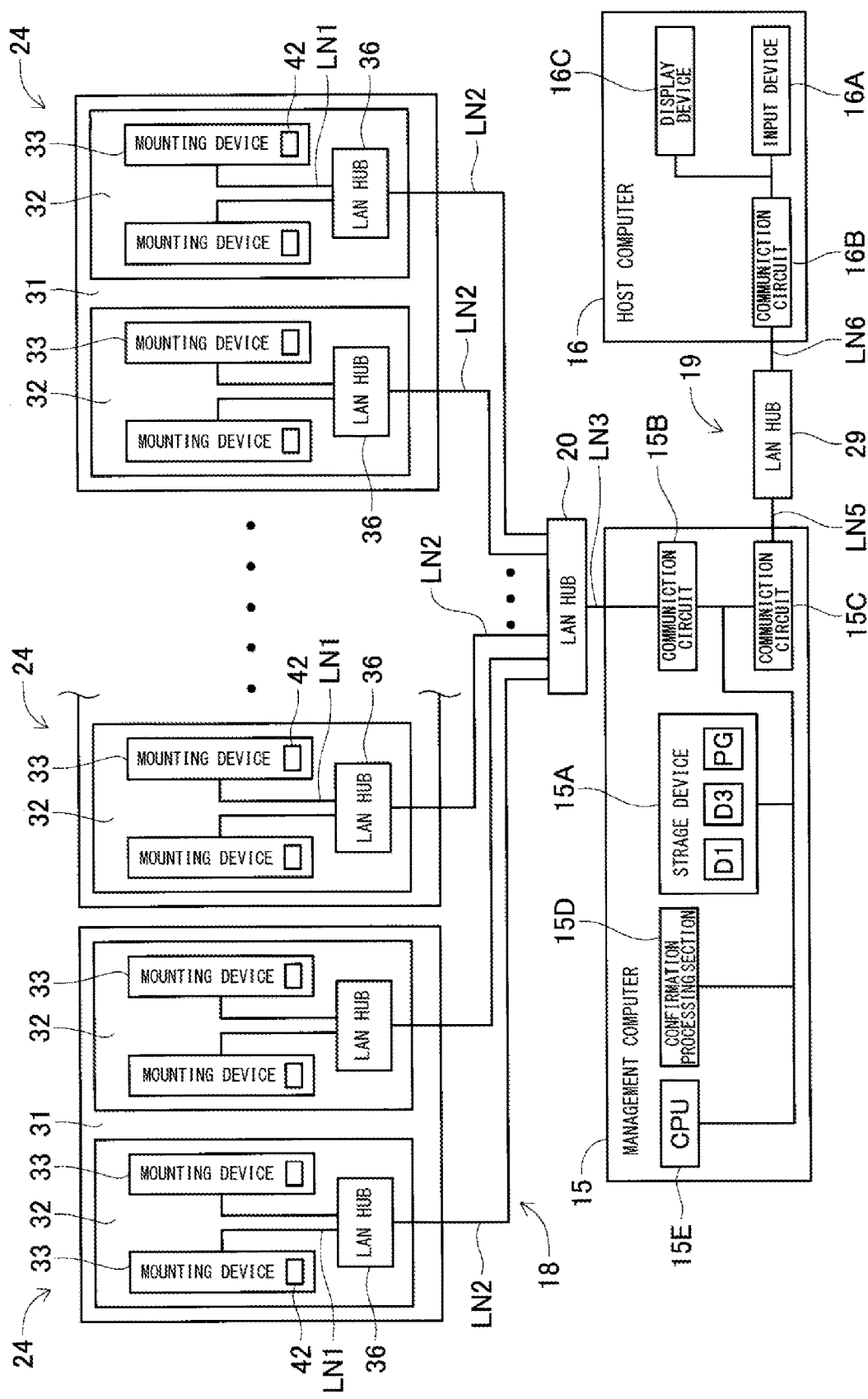
FIG. 2 A diagram illustrating configurations of a first network that connects a management PC and mounting systems and a second network that connects the management PC and a host computer.

Next, configurations of first network 18 and second network 19 of substrate work system 10 will be described. In the following description, as illustrated in FIG. 2, in second network 19 of substrate work system 10, a configuration of a part that connects multiple mounting systems 24 with management computer 15 will be described. The configuration of first network 18 that connects the other pieces of equipment than mounting systems 24 such as substrate feeders 21 and the like with management computer 15 is similar to the configuration of mounting systems 24 illustrated in FIG. 2, and therefore, the description thereof will be omitted here. In addition, a confirmation process of confirming a communication failure of first network 18 carried out by mounting system 24, which will be described later, can also be carried out on the other substrate work devices (substrate feeder 21 and the like) than mounting system 24.

As illustrated in FIG. 2, one mounting system 24 includes one base 31, two modules 32 arranged side by side on base 31, two mounting devices 33 disposed on each of modules 32, and the like. Two mounting devices 33 disposed on module 32 are connected to each other via LAN hub 36 provided on module 32.

LAN hub 36 are connected to each of two mounting devices 33 via LAN cable LN1. Each of LAN hubs 36 is connected to LAN hub 20 provided in a communication room (not shown) or the like in an assembling plant via LAN cable LN2. Accordingly, two modules 32 provided on base 31 are connected to each other via LAN hub 20 and LAN cables LN2. LAN hubs 20 and 36 are, for example, switching hubs. LAN hub 20 is connected to communication circuit 15B that management computer 15 includes via LAN cable LN3.

Accordingly, each of mounting devices 33 is connected to management computer 15 via first network 18 through LAN cables LN1 to LN3 and LAN hubs 20 and 36. First network 18 is made up, for example, of a star-type local area network in which LAN cables LN2 and the like are collected by LAN hub 20 and can execute communications in accordance with the TCP/IP protocol. The configuration of first network 18 described above is one example and can be modified as required according to how mounting systems 24 are arranged. The communication protocol used for first network 18 is not limited to the TCP/IP protocol, and hence, other communication protocols may be adopted. A communication through first network 18 is not limited to a wired communication, and hence, a wireless communication may be adopted.

Management computer 15 includes storage device 15A, communication circuit 15B, communication circuit 15C, confirmation processing section 15D, CPU 15E, and the like. Communication circuits 15B and 15C can execute communications in accordance with the TCP/IP protocol, for example. Storage device 15A and communication circuits 15B and 15C are connected to each other by, for example, an internal bus in a processing substrate on which CPU 15E is mounted. Communication circuit 15C is connected with LAN hub 29 via LAN cable LN5. LAN hub 29 is connected with communication circuit 16 of host computer 16 via LAN cable LN6.

Accordingly, host computer 16 is connected with management computer 15 via second network 19 through LAN cables LN5, LN6 and LAN hub 29. Second network 19 is, for example, a network that is different from first network 18 provided in the assembly plant and is an in-house network used in an office or the like. Host computer 16 includes a display device 16C in addition to input device 16A described above and communication circuit 16B. Host computer 16 displays, on display device 16C, what is changed in the production program input thereinto via input device 16A.

3. Configuration of Mounting Device

Figure 3:
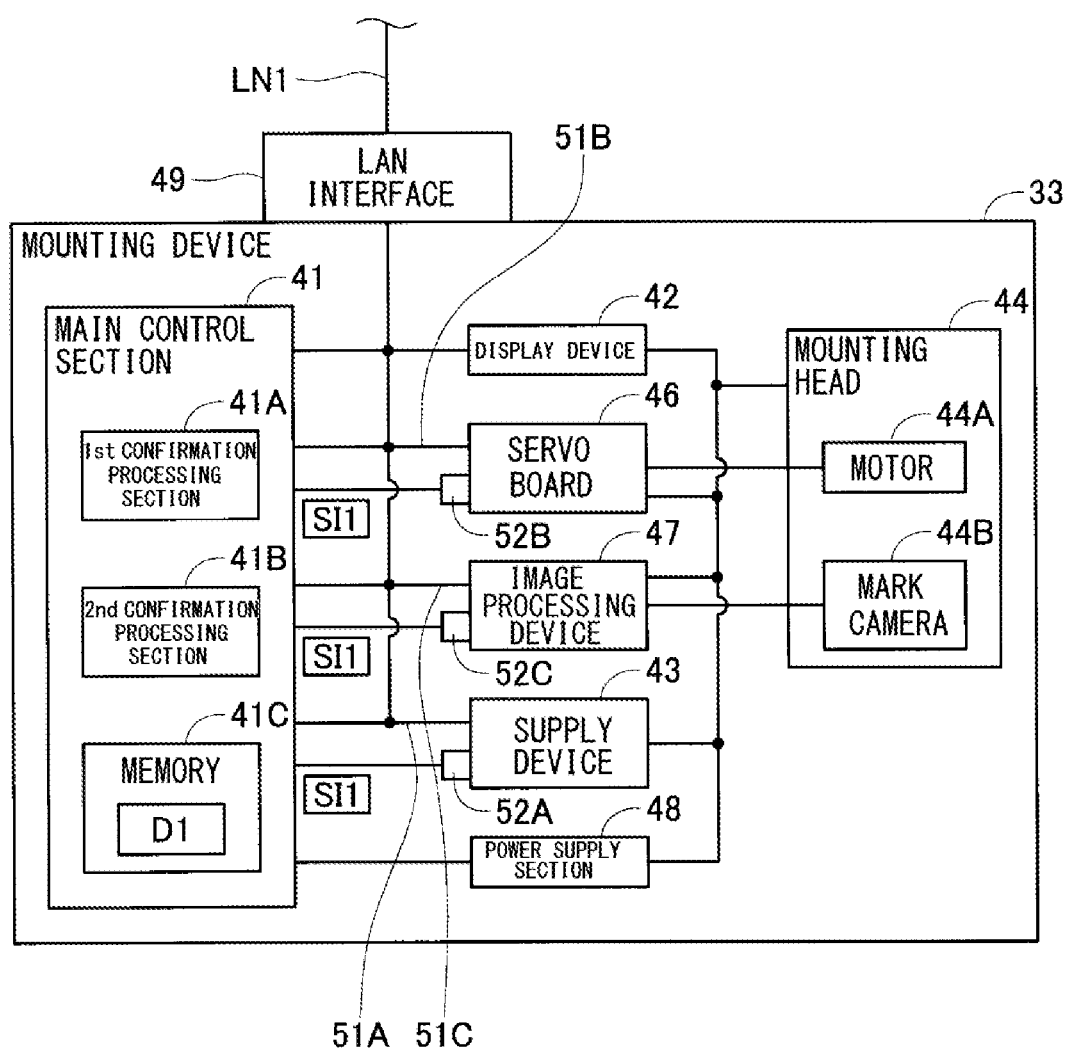
FIG. 3 A block diagram of a mounting device.

Next, the configuration of mounting device 33 will be described. FIG. 3 illustrates a block diagram of mounting device 33. As illustrated in FIG. 3, mounting device 33 includes main control section 41, display device 42, supply device 43, mounting head 44, servo board 46, image processing board 47, power supply section 48, and LAN interface 49. Main control section 41 is, for example, a processing substrate including CPU, a memory, and the like and collectively controls operations of mounting device 33 by controlling display device 42, servo board 46, and the like.

Display device 42 is, for example, a touch panel and includes a liquid crystal panel, a light source of LED or the like that shines light from a rear side of the liquid crystal panel, a touch sensing film applied to a front surface of the liquid crystal panel, and the like. Display device 42 displays information on mounting device 33 according to what is operated by the operator.

Supply device 43 includes, for example, multiple tape feeders each configured to supply electronic components 12 from a carrier tape where electronic components 12 (refer to FIG. 1) are taped. Supply device 43 is connected with main control section 41 via communication line 51A. Supply device 43 supplies electronic components 12 to a supply position at predetermined timings based on a control by main control section 41. Supply device 43 is not limited to the feeder-type supply device and hence may be a tray-type supply device configured to supply electronic components 12 disposed on a tray.

Mounting head 44 includes motor 44A functioning as a driving source and a mark camera 44B. Servo board 46 is connected with main control section 41 via communication line 51B. Servo board 46 transmits encoder information received from an encoder of motor 44A to main control section 41 via communication line 51B. Servo board 46 controls electric power (three-phase alternating current or the like) that is supplied to motor 44A based on control information from main control section 41. As a result, motor 44A is controlled in relation to rotational position, speed, and the like. Motor 44A changes, for example, the position of mounting head 44, the position of a suction nozzle (not shown) configured to pick up and hold electronic component 12, and the like. Mounting head 44 picks up electronic component 12 supplied to the supply position of supply device 43 and mounts it on substrate 11 in accordance with driving of motor 44A.

Marker camera 44B is, for example, a camera configured to image a mark provided on substrate 11. When referred to herein, the mark is identification information that identifies substrate 11. Alternatively, the mark constitutes identification information for identifying a defective processing substrate from multiple processing substrates, for example, when multiple processing substrates (small substrates for a smartphone) are collectively assembled onto one substrate 11.

Image processing board 47 is connected with main control section 41 via communication line 51C. Image processing board 47 issues an imaging command to mark camera 44B based on a control by main control section 41. Image processing board 47 corrects image data received from mark camera 44B and transmits the corrected image data to main control section 41. As a result, main control section 41 changes a position to which mounting head 44 is moved and the like based on the image data imaged by mark camera 44B to thereby be able to perform mounting work as required.

Power supply section 48 functions as a driving source for supplying electric power to main control section 41, display device 42, supply device 43, mounting head 44, servo board 46, and image processing board 47. Mounting device 33 is connected with LAN hub 36 (refer to FIG. 2) via LAN cable LN1 that is connected to LAN interface 49.

(3-1. Configuration of External Interfaces 52 A to 52 C)

As illustrated in FIG. 3, supply device 43 is connected with main control section 41 via external interface 52A. Similarly, servo board 46 is connected with main control section 41 via external interface 52B. Similarly, image processing board 47 is connected with main control section 41 via external interface 52C. External interfaces 52A, 52B, and 52C individually output a confirmation signal SI1 to main control section 41, the confirmation signal SI1 indicating whether electric power is supplied individually to external interfaces 52A to 52C from power supply section 48. For example, external interface 52A outputs confirmation signal SI1 of a high level with electric power supplied to supply device 43 from power supply section 48. With no electric power supplied to supply device 43 from power supply section 48 or supply device 43 not actuated irrespective of electric power being supplied thereto (with a power kept switched off), external interface 52A outputs confirmation signal SI1 of a low level. As a result, main control section 41 can determine on an electric power supply state at supply device 43 and the like by detecting confirmation signals SI1 output from external interfaces 52A to 52C. Supply device 43, servo board 46 and image processing board 47 are examples of sub-control sections in this patent application.

4. Confirmation of Communication Error

Figure 4:
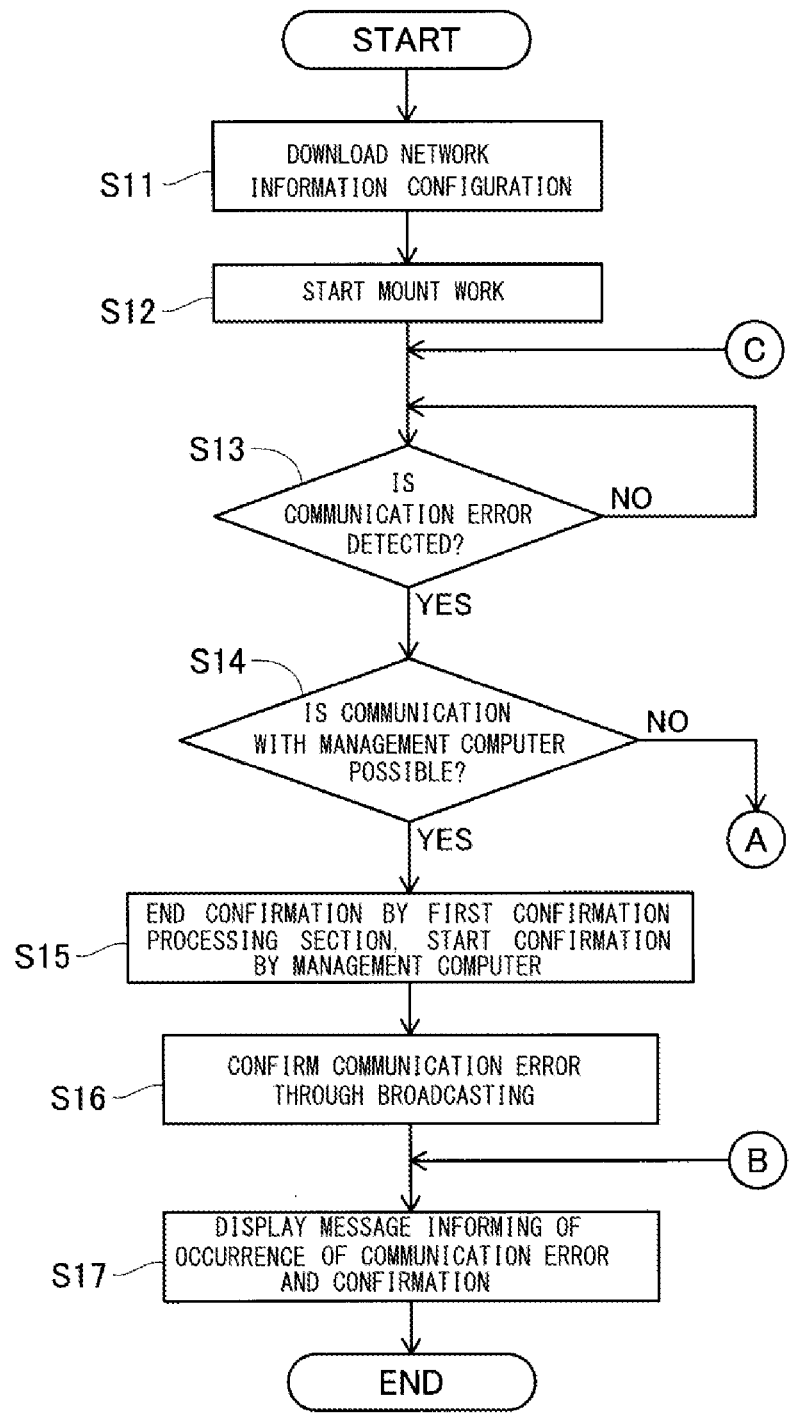
FIG. 4 A flowchart illustrating processing operations of the substrate work system when a communication error occurs in the first network.
Figure 5:
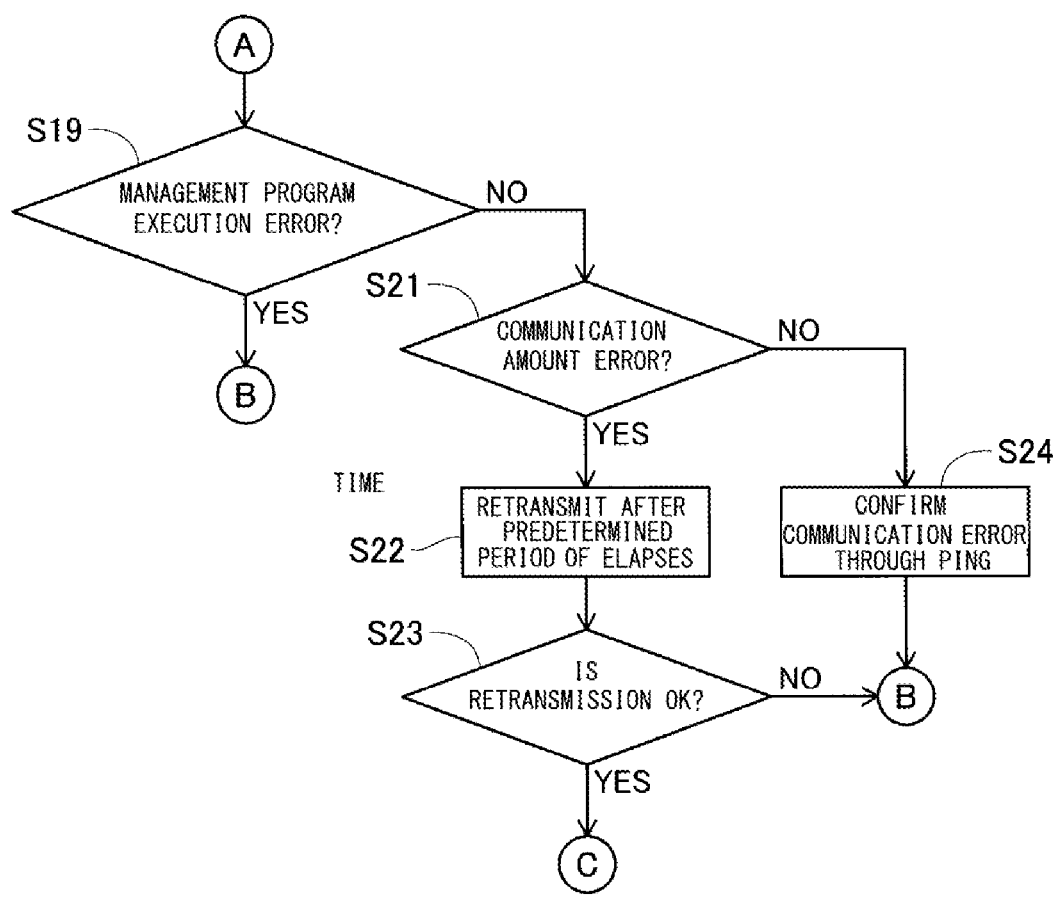
FIG. 5 A flowchart illustrating processing operations of the substrate work system when a communication error occurs in the first network.

Next, processing operations performed in substrate work system 10 when a communication error occurs in first network 18 will be described. FIGS. 4 and 5 illustrate flowcharts illustrating processing operations performed when an communication error occurs.

Here, as illustrated in FIG. 2, management computer 15 includes confirmation processing section 15D configured to determine a cause for a communication error in a communication path of first network 18, when a communication error occurs. As illustrated in FIG. 3, main control section 41 of each mounting device 33 includes first confirmation processing section 41A and a second confirmation processing section 41B. Processing by confirmation processing section 15D, first confirmation processing section 41A, and second confirmation processing section 41B may be implemented, for example, by executing programs using CPU that main control section 41 or the like includes. Alternatively, confirmation processing section 15D or the like may be configured by exclusive hardware. Determination of a cause for a communication error by second confirmation processing section 41B will be described later.

When activated, for example, substrate work system 10 executes processes illustrated i FIGS. 4 and 5. Firstly, in S11 in FIG. 4, substrate work system 10 downloads network configuration information D1 onto each mounting device 33 from management computer 15. This network configuration information D1 is information for use in specifying a transmission destination (mounting device 33 or the like) when transmitting data in first network 18. Specifically, network configuration information D1 is, for example, data associating identification information for identifying each mounting device 33 with IP address set in LAN interfaces 49 of each mounting device 33. For example, when a communication error occurs, network configuration information D1 is used in separating and confirming an error portion of the communication path based on PING data D4 (refer to FIG. 9) that is transmitted from first confirmation processing section 41A of mounting device 33. Mounting device 33 acquires network configuration information D1 every time mounting device 33 is activated to thereby be able to acquire network configuration information D1 corresponding to the latest network configuration. Mounting devices 33 may be made to acquire network configuration information D1 only when there is a change in network configuration.

Main control section 41 of each mounting device 33 stores network configuration information D1 downloaded from management computer 15 in, for example, memory 41C (refer to FIG. 3). Next, substrate work system 10 starts mounting work based on a production program and a production plan prepared by the operator (S12).

Next, first confirmation processing section 41A of each mounting device 33 determines whether a communication error exists (S13). If no communication error is detected (S13: NO), first confirmation processing section 41A repeats the process in S13.

Figure 6:
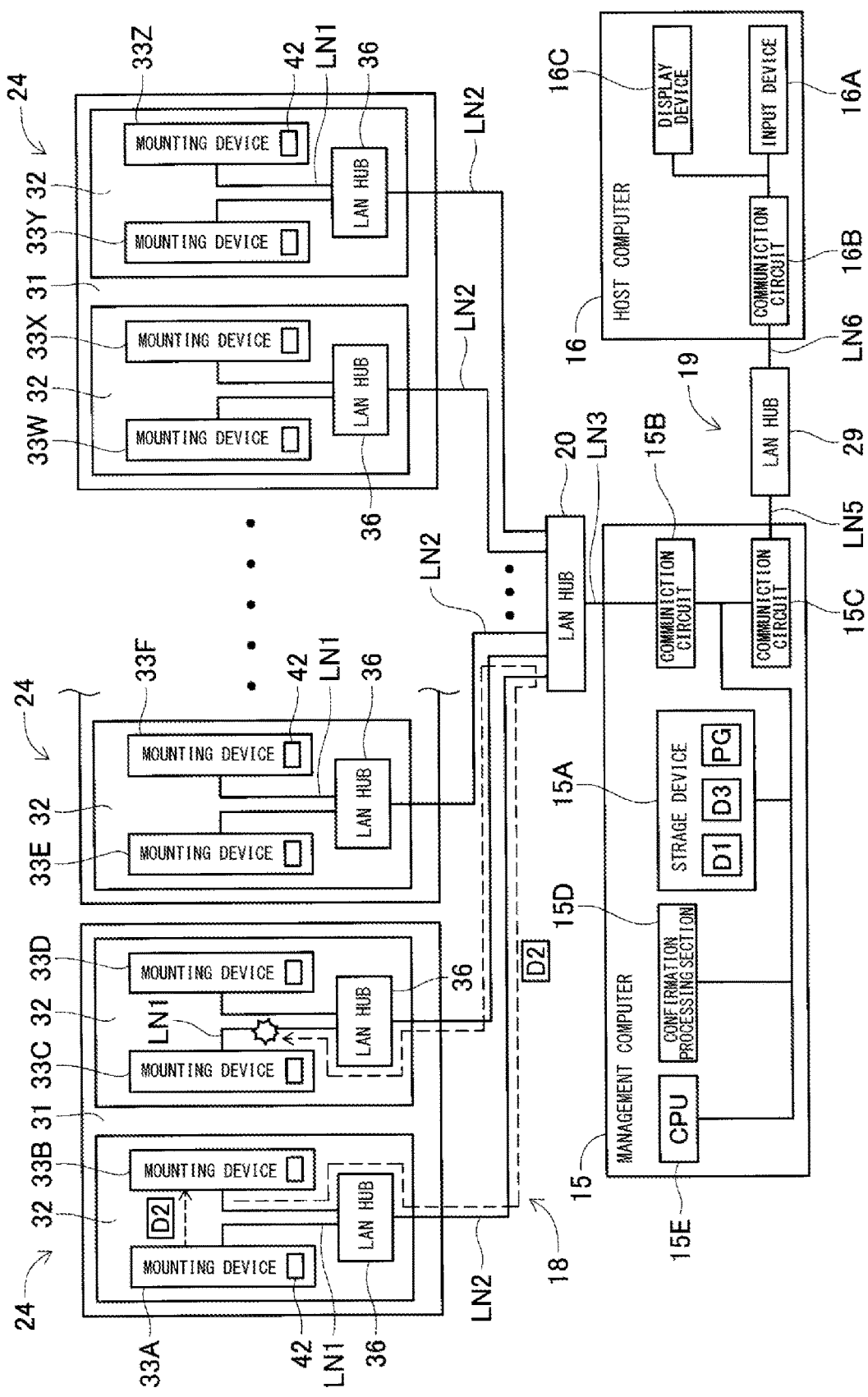
FIG. 6 A diagram illustrating a state of the substrate work system when a communication error occurs.

FIG. 6 illustrates an example of a state where a communication error occurs. In the following description, as illustrated in FIG. 6, to distinguish multiple mounting devices 33 from one another, mounting devices are sequentially referred to as 33A, 33B, 33C, . . . , 33Z from mounting device 33 disposed most upstream in production line 13. When individual mounting devices 33 are referred to collectively without distinguishing them from one another, mounting devices are referred to simply as mounting devices 33 with no alphabetical suffix given to the reference numeral.

As described above, when multiple processing substrates are collectively assembled onto one substrate 11, mounting device 33A situated most upstream confirms to which processing substrate in the multiple processing substrates a mark indicating a defective substrate is applied. For example, before starting mounting work of mounting electronic components 12 on substrate 11, mounting device 33A images marks on individual processing substrates using mark camera 44B (refer to FIG. 3) and confirms the marks. Next, Before starting conveying substrate 11 to a downstream side, mounting device 33A transmits setting data D2 to mounting device 33B situated downstream thereof. This setting data D2 is data indicating the position of a defective processing substrate, that is, the position of a processing substrate on which mounting work of mounting electronic component 12 does not have to be performed. As a result, before staring mounting work, downstream mounting device 33B does not have to perform repeatedly work of inspecting the position of a defective substrate using mark camera 44B, that is, the work that has been performed by upstream mounting device 33A. This setting data D2 is one example of setting data for substrate work in this patent application. Setting data D2 is not limited to the information on defective substrate described above but may be information on, for example, conveyance timing or speed of substrate 11 that is used commonly among the devices (substrate feeder 21 and the like) of production line 13.

Next, second upstream-most mounting device 33B transmits setting data D2 received from mounting device 33A to downstream mounting device 33C. In this manner, mounting devices 33 downstream of mounting device 33B transfer setting data D2 to downstream mounting devices 33, whereby downstream mounting devices 33 can be prevented from doing the same operation repeatedly (can improve the work efficiency). At this time, for example, as illustrated in FIG. 6, let's assume that a disconnection occurs in LAN cable LN1 that connects mounting device 33C with LAN hub 36. In this case, first confirmation processing section 41A of mounting device 33B detects that a communication error occurs in first network 18 due to receiving no reply that setting data D2 is received from downstream mounting device 33C (S13: YES). In this way, first confirmation processing section 41A detects an occurrence of a communication error when no normal reply is received in a communication associated with mounting work. A communication error of setting data D2 may be detected by confirmation processing section 15D of management computer 15. In addition, when detecting a communication error, substrate work system 10 may stop mounting work to generate a warning sound or the like from mounting device 33B after placing the mounting device in a safety state (a state where mounting head 44 is withdrawn).

When detecting an occurrence of a communication error (S13: YES), first confirmation processing unit 41A of mounting device 33B determines whether first confirmation processing section 41A can communicate with management computer 15 (S14). For example, first confirmation processing section 41A transmits, to management computer 15, data indicating that a communication error is detected and that a reply is required.

(4-1. When Receiving Reply from Management Computer 15)

In the example illustrated in FIG. 6, since the communication path between mounting device 33B and management computer 15 is normal, first confirmation processing section 41A of mounting device 33B confirms a reply from management computer 15 (S14: YES). Since it confirms that no communication error exists (S14: YES), first confirmation processing section 41A stops a process of determining further a cause for the communication error (S15).

On the other hand, since it is informed of an occurrence of a communication error by first confirmation processing section 41A of mounting device 33B, management computer 15 starts a process of determining a cause for the communication error in first network 18 (S15). Here, for example, after substrate work system 10 is activated, confirmation processing section 15D of management computer 15 transmits confirmation data D3 (an example of a third confirmation data) to all the devices (mounting devices 33 and the like) that are connected to first network 18 every predetermined time. Confirmation processing section 15D transmits confirmation data D3 that designates a broadcast address as an IP address and confirms replies from the individual devices (mounting devices 33 and the like). Then, confirmation processing section 15D stores in advance results of replies to confirmation data D3 in such a state that the communication of first network 18 is normal in storage device 15A.

Next, with an occurrence of a communication error, in the process in S15, when receiving data informing of an occurrence of a communication error in first network 18 from mounting device 33, confirmation processing section 15D transmits again confirmation data D3 to all the devices that are connected to first network 18 (S16). Confirmation processing section 15D compares the results of the replies to confirmation data D3 at the normal case that are stored in advance in storage device 15A with the result of a reply to confirmation data D3 transmitted in S16 at the abnormal case and determines a cause for the communication error in the communication path.

In the example illustrated in FIG. 6, all devices 33 reply at the normal case, whereas at the abnormal case, mounting device 33C does not reply. Confirmation processing section 15D detects a communication path were the communication error is occurring based, for example, on the results of the comparison and the network configuration. In this case, since of two mounting devices 33C and 33D that are connected to the same LAN hub 36, mounting device 33C does not reply, confirmation processing section 15D can detect that the communication error is occurring in the communication path from LAN hub 36 to mounting device 33C. Therefore, confirmation processing section 15D can detect a possibility of disconnection of LAN cable LN1 that connects mounting device 33C and LAN hub 36.

Next, confirmation processing section 15D executes a process of displaying a message informing of an occurrence of a communication error and the results of the confirmation (S17). Confirmation processing section 15D displays the message informing of the occurrence of a communication error or the like on, for example, display device 16C of host computer 16 or display device 42 of mounting device 33B that detects the communication error (S17). For example, first confirmation processing section 41A of mounting device 33B switches displays on display device 42 based on data received from confirmation processing section 15D of management computer 15.

Figure 7:
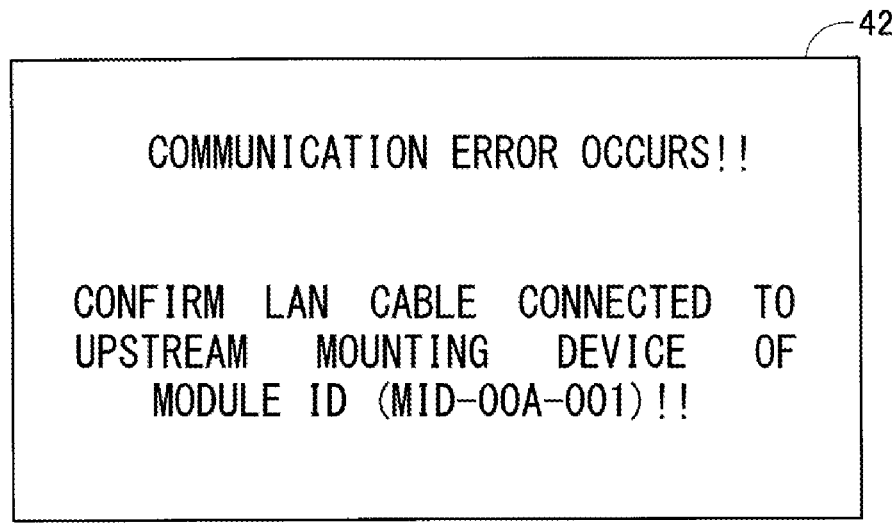
FIG. 7 A diagram illustrating a message displayed on a display device when a communication error occurs.

FIG. 7 illustrates one example of a display on display device 42. A module ID (MID-00A-011) illustrated in FIG. 7 is identification information of module 32 that includes mounting device 33C. In the example illustrated in FIG. 6, of two mounting devices 33C and 33D provided on one module 32, since LAN cable LN1 connecting upstream mounting device 33C with LAN hub 36 should be confirmed, a message informing to that effect is displayed on display device 42 (refer to FIG. 7). As a result, the operator can confirm in which communication path the communication error is occurring by checking the display on display device 42. The results of the confirmation may be displayed not only on display device 42 but also display device 16C (a notification section) of management computer 15. In addition to the display on display device 42, mounting device 33B that detects the communication error may inform the operator of the occurrence of abnormality by illuminating a warning lamp or activating a buzzer. In addition, mounting device 33B may display the message informing of the occurrence of abnormality on or send a notification to that effect to a mobile terminal of the operator.

(4-2. When Receiving No Reply from Management Computer 15)

Next, a case will be described where no reply is received from management computer 15 in S14 described above. In S14, if no reply is received from management computer 15 in S14 (S14: NO), first confirmation processing section 41A determines another cause for the communication error.

Here, as the other cause, for example, a case is considered where management program PG is not executed properly in CPU 15E of management computer 15 described above or where since management program PG stops operation, a communication error occurs between mounting devices 33 and management computer 15. For example, if first confirmation processing section 41A of each mounting device 33 receives no reply from management computer 15 although first confirmation processing section 41A has to communicate with management computer 15 during mounting work, first confirmation processing section 41A detects a communication error (S13 in FIG. 4: YES) and cannot communicate with management computer 15 (S14: NO). First confirmation processing section 41A confirms the execution of management program PG in management computer 15 (S19 in FIG. 5).

Figure 8:
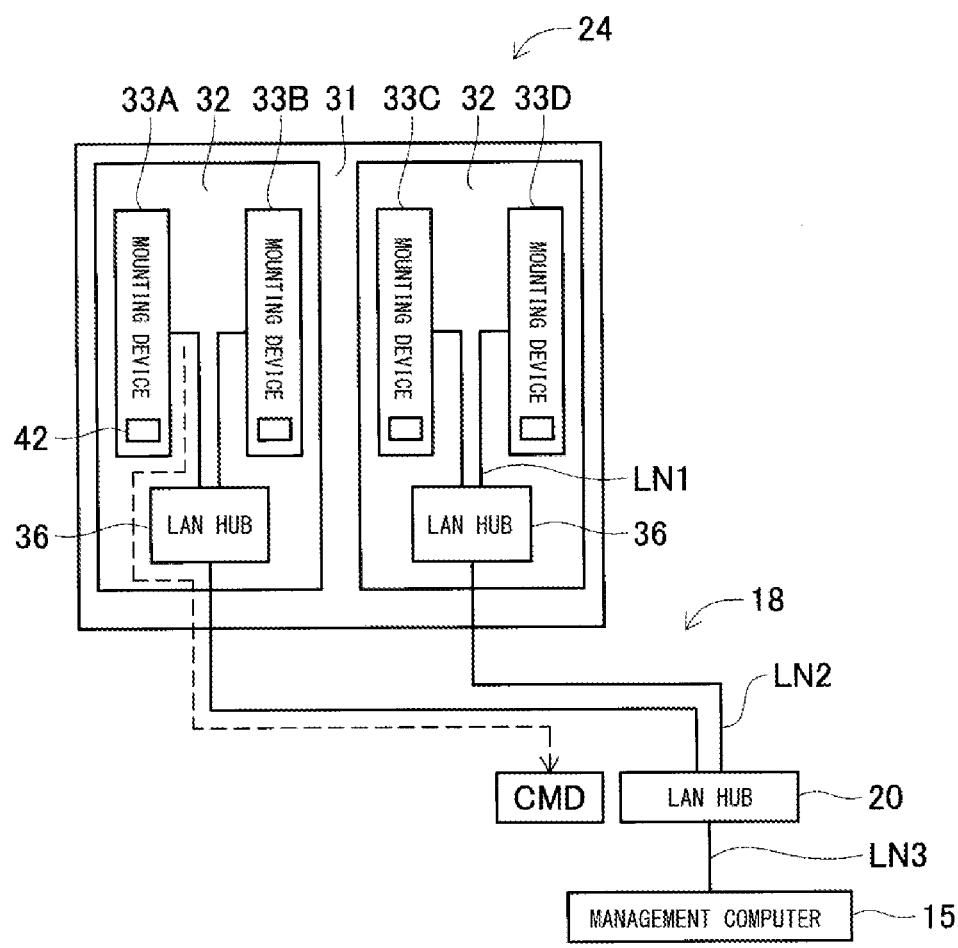
FIG. 8 A diagram illustrating a communication for confirming a management program.

FIG. 8 illustrates a communication confirming management program PG. Note that to prevent FIG. 8 from getting crowded, the configuration of substrate work system 10 illustrated in FIG. 2 is simplified in FIG. 8. In S19, first confirmation processing section 41A, which detects the communication error with management computer 15, transmits control command CMD (second confirmation data) to management computer 15 as illustrated in FIG. 8, the control command CMD confirming whether management program PG is executed properly. For example, CPU 15E (refer to FIG. 2) of management computer 15 executes a monitoring program for monitoring an execution state of management program PG separately from management program PG. Then, first confirmation processing section 41A transmits control command CMD for this monitoring program to confirm whether management program PG is executed properly. Alternatively, first confirmation processing section 41A may transmit control command CMD for, for example, an operating system (OS) of management computer 15 to inquire about the execution state of management program PG.

When receiving from management computer 15 a message informing that management program PG is not executed properly (S19: YES), first confirmation processing section 41A executes S17 in FIG. 4. First confirmation processing section 41A may display on display device 42 a message informing that an execution error of management program PG is occurring in management computer 15 together with a message informing that a communication error is occurring. As a result, the operator can execute an appropriate countermeasure such as rebooting management computer 15 by operating host computer 16. Management computer 15 may reboot itself automatically or the like based on the detection of the execution error of management program PG.

As a further cause for the communication error, a congested communication is considered. Then, if management program PG is executed properly in management computer 15 (S19: NO), first confirmation processing section 41A determines on an amount of communication (S21). First confirmation processing section 41A calculates an amount of data that is transmitted and received between mounting device 33 that includes that particular first confirmation processing section 41A and first network 18 (S21).

For example, as illustrated in FIG. 3, main control section 41 and image processing board 47 are connected to each other via LAN interface 49 (LAN cable LN1) and share a communication path connected to first network 18. Due to this, for example, in the case where a large amount of image data is transmitted from image processing board 47 to management computer 15, resulting in a congested communication, in main control section 41 that shares the communication path, there occurs a communication error (a delayed communication or the like) where main control section 41 cannot communicate with management computer 15.

Then, first confirmation processing section 41A inquires LAN interface 49 about an amount of data that is transmitted and received thereby, and if first confirmation processing section 41A transmits and receives a predetermined amount of data or more, first confirmation processing section 41A determines that a congested communication is occurring (S21: YES).

If it is determined that congestion is occurring (S21: YES), first confirmation processing unit 41A informs a unit (for example, main control section 41) that is waiting to transmit data of an occurrence of congestion and instructs main control section 41 to retransmit the data after a predetermined period of time elapses (S22). As a result, when the congested communication is occurring temporarily, main control section 41 can communicate with management computer 15. When retransmitting the data and receiving a notification of reception of the data from management computer 15 (S23: YES), main control section 41 informs first confirmation processing section 41A to that effect. First confirmation processing section 41A starts processes from S13 and on in FIG. 4. In this case, since no physical failure such as disconnection is occurring in first network 18, mounting work can continue by avoiding the congested communication occurring temporarily.

On the other hand, if main control section 41 fails to retransmit the data (S23: NO), there is a possibility that the occurrence of the congested communication is not temporary. For example, there is a possibility that image processing board 47 continues to transmit a large amount of data due to a program failure. In this case, main control unit 41 informs first confirmation processing section 41A that it fails to retransmit the data. First confirmation processing section 41A executes a process of displaying a message informing of an occurrence of a communication error and the results of the confirmation (the possibility of an occurrence of a congested communication) (S17 in FIG. 4). In addition to the amount of communication at LAN interface 49, first confirmation processing section 41A may inquire LAN hub 36 about an amount of data communication to confirm a congested communication in LAN hub 36.

Figure 9:
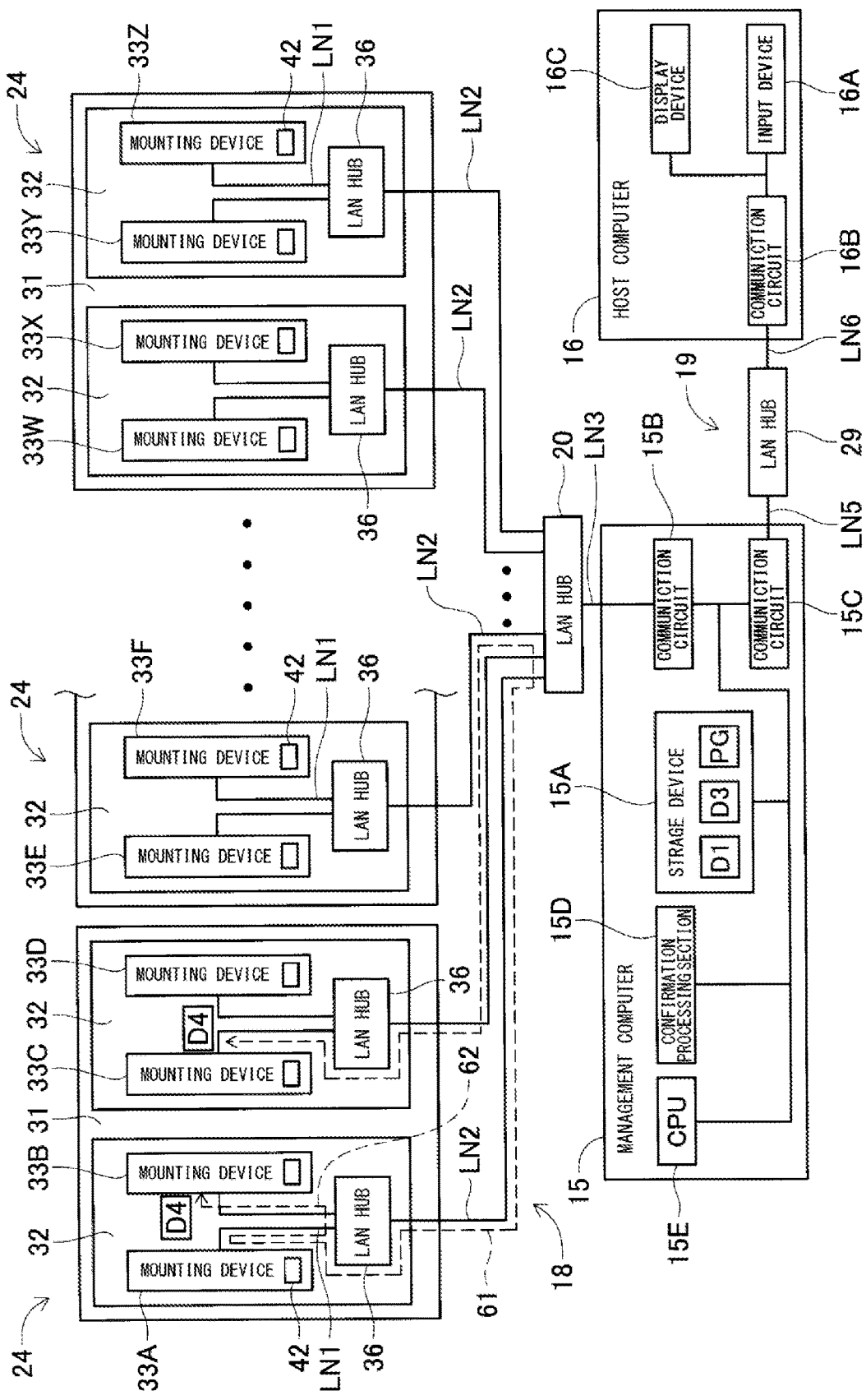
FIG. 9 A diagram illustrating a confirmation of a communication by PING data.

If no congested communication is occurring (S21: NO), first confirmation processing section 41A executes a process of determining a cause for the communication error based on PING data D4 (S24). Referring to FIG. 9, a process where first confirmation processing section 41A of mounting device 33A transmits PING data D4 will be described as an exemplary process.

First confirmation processing section 41A of mounting device 33A (refer to FIG. 3) determines on a transmission destination of PING data D4 based on network configuration information D1 downloaded from management computer 15 in S11 (S24). In network configuration information D1, in addition to identification information and IP addresses of individual mounting devices 33, a procedure of separating an abnormal part in a communication path is set. As a procedure, for example, a procedure of separating an abnormal part from management computer 15 (an upstream side) of first network 18 is set. Information on the abnormal part separating procedure may be prepared as different information from network configuration information D1.

Specifically, for example, first confirmation processing section 41A of mounting device 33A transmits PING data D4 to mounting device 33C, which is connected therewith via LAN hub 20, as illustrated in FIG. 9 (refer to transmission path 61 in FIG. 9). As a result, when there is a reply to PING data D4 coming from mounting device 33, it can be determined that a communication path of "mounting device 33A→LAN hub 36→LAN hub 20→LAN hub 36→mounting device 33C" is normal. In this case, no communication with management computer 15 is possible in S14 (S14: NO), and a communication between mounting device 33A and LAN hub 20 becomes possible. Due to this, first confirmation processing section 41A of mounting device 33A determines that there is a possibility that abnormality (a disconnection of LAN cable LN3 or the like) exists in a communication path between LAN hub 20 and management computer 15. The abnormal part separation procedure using PING data D4 and the determination method after the separation of the abnormal part are changed as required according to the configuration of first network 18. Before transmitting PING data D4 to mounting device 33C, first confirmation processing section 41A may firstly transmit PING data D4 towards management computer 15 to reconfirm a communication error between management computer 15 and itself.

When receiving no reply from mounting device 33C, first confirmation processing section 41A of mounting device 33A transmits PING data D4 towards mounting device 33B that is connected to same LAN hub 36 (refer to transmission path 62 in FIG. 9). When receiving a reply from mounting device 33B, first confirmation processing section 41A determines on a possibility that abnormality is occurring, for example, in the equipment (LAN hub 20 or LAN cable LN2) situated upstream of LAN hub 36. Additionally, when receiving no reply from mounting device 33B, first confirmation processing section 41A determines on a possibility that abnormality is occurring, for example, in the equipment (failure of LAN hub 36 or disconnection of LAN cable LN1) situated downstream of LAN hub 36. In this manner, first confirmation processing section 41A confirms in which communication path the communication error is occurring in first network 18. Then, first confirmation processing section 41A executes a process of displaying a message informing of an occurrence of a communication error and the results of the confirmation on mounting device 33 that includes that particular first confirmation processing section 41A (in the above example, mounting device 33A) (S17 in FIG. 3).

(4-3. Confirmation Processing by Second Confirmation Processing Section 41 B)

Next, a process of confirming a communication error by second confirmation processing section 41B will be described. As illustrated in FIG. 3, supply device 43, servo board 46, and image processing board 47 are connected to main control section 41 via corresponding external interfaces 52A to 52C. Second confirmation processing section 41B of main control section 41 can determine whether electric power is supplied to supply device 43 and the like by detecting confirmation signals SI1 output individually from external interfaces 52A to 52C. Thus, when a communication error occurs in communication lines 51A to 51C, second confirmation processing section 41B confirms whether confirmation signals SI1 are output from external interfaces 52A to 52C so that it can determine whether the communication error is occurring due to disconnection of communication lines 51A to 51C or the communication error is occurring due to no electric power being supplied to supply device 43 and the like originally or due to supply device 43 and the like being not switched on.

For example, with substrate work system 10 (mounting devices 33) activated, when receiving no reply from supply device 43 although transmitting initial setting data to supply device 43 via communication line 51A, main control section 41 executes confirmation processing by second confirmation processing section 41B. Second confirmation processing section 41B confirms whether normal confirmation signal SI1 (confirmation signal SI1 of a high level) is output from external interface 52A. When confirming that confirmation signal SI1 of a high level is output accordingly, that is, electric power is supplied to supply device 43, second confirmation processing section 41B determines, for example, that communication line 51A is disconnected. When confirming that confirmation signal SI1 of a low level is output, second confirmation processing section 41B determines that a failure relating to the supply of electric power to supply device 43 is occurring. Second confirmation processing section 41B displays a message informing that a communication error occurs in communication lines 51A to 51C and the results of the confirmation on, for example, display device 42. As a result, second confirmation processing section 41B can confirm a communication error that is difficult to be found such as a disconnection of communication line 51A in mounting device 33 and inform the operator of an occurrence of such a communication error.

Incidentally, substrate feeder 21, printer 22, mounting system 24 (mounting device 33), mounting work result inspection machine 25, reflow furnace 27 and final inspection machine 28 are examples of substrate work devices. Management computer 15 is one example of a management device. First confirmation processing section 41A and confirmation processing section 15D are examples of a first confirmation processing section. Display device 42 and display device 16C are examples of a notification section. PING data D4 is one example of first confirmation data. Control command CMD is one example of second confirmation data. Confirmation data D3 is one example of third confirmation data. Electronic component 12 is one example of a component. Supply device 43, servo board 46 and image processing board 47 are examples of sub-control sections.

5. Advantageous Effects

Thus, according to the embodiment that has been described in detail heretofore, the following advantageous effects are provided.

(First Advantageous Effect)

A substrate work system 10 of the present embodiment includes multiple substrate work devices (for example, mounting devices 33) connected to each other via first network 18 (a network) and configured to perform work on substrate 11, management computer 15 (a management device) connected to multiple mounting devices 33 via first network 18 to manage multiple mounting devices 33, a first confirmation processing section (first confirmation processing section 41A and confirmation processing section 15D) provided on at least one device out of multiple mounting devices 33 and management computer 15 and configured to determine a cause for a communication error of LAN cable LN1 or the like (a communication path) connecting at least two devices of multiple mounting devices 33 and management computer 15 together in response to an occurrence of a communication error in first network 18, and a notification section (display device 42, display device 16C) configured to notify an occurrence of a communication error in first network 18 and a result of confirmation by first confirmation processing section 41A and the like.

According to this, in response to an occurrence of a communication error in first network 18, first confirmation processing unit 41A and the like determine a cause for the communication error in a communication path between two devices to thereby be able to confirm whether the communication error is occurring in that particular communication path. Second display device 42 and the like (the notification section) inform the operator or the like of substrate work system 10 of the results of the confirmation by first confirmation processing section 41A and the like, in addition to a message informing that the communication error occurs in first network 18. As a result, the operator or the like can confirm in which communication path the communication error is possibly occurring in first network 18 connecting multiple mounting devices 33 and management computer 15 by checking the content displayed on display device 42 or the like. Since the operator or the like can locate and grasp the abnormal part quickly, the time spent dealing with the communication error can be reduced.

(Second Advantageous Effect)

First confirmation processing section 41A and the like determine a cause for the communication error in the communication path by making a confirmation communication between at least two devices out of multiple mounting devices 33 and management computer 15.

According to this, first confirmation processing section 41A and the like makes a confirmation communication intentionally between two devices after an occurrence of a communication error and then can confirm the occurrence of the communication error in the communication path based, for example, on whether there is a reply to the confirmation data or the content of the reply.

(Third Advantageous Effect)

substrate work system 10 includes further network configuration information D1 necessary to specify a transmission destination for when transmitting data to multiple mounting devices 33 via first network 18. First confirmation processing section 41A is provided on at least one mounting device 33 of multiple mounting devices 33 and transmits PING data D4 (first confirmation data) to at least one device out of the other mounting devices 33 and management computer 15 based on network configuration information D1 in response to an occurrence of a communication error in first network 18 to determine a cause for the communication error in the communication path in accordance with a reply to PING data D4 (S24 in FIG. 5).

According to this, first confirmation processing section 41A transmits PING data D4 to other devices (devices other than mounting device 33 to which PING data D4 is transmitted) on first network 18 in response to an occurrence of a communication error and confirms a communication error in the communication paths based on whether there is a reply from the other devices and the contents of replies. As a result, first confirmation processing section 41A can confirm in which communication path on first network 18 the communication error is occurring based on whether there is a reply from the devices.

(Fourth Advantageous Effect)

Management computer 15 executes management program PG for managing multiple mounting devices 33. First confirmation processing section 41A is provided on at least one mounting device 33 of multiple mounting devices 33 and transmits control command CMD (second confirmation data) for confirming whether management program PG is executed properly to management computer 15 in response to an occurrence of a communication error in a communication path between management computer 15 and itself to determine a cause for the communication error in the communication path between management computer 15 and itself in accordance with a reply from management computer 15 (S19 in FIG. 5).

According to this, first confirmation processing section 41A transmits control command CMD (second confirmation data) to management computer 15 in response to an occurrence of communication error in a communication path between management computer 15 and itself. For example, in a configuration where management program PG (applications and processes) in management computer 15, there is a possibility that management program PG is not executed properly (the applications are not activated, or the like) due to a cause such as a setting error or the like. In this case, even though there is no abnormality found in a communication path between mounding device 33 and management computer 15, it becomes difficult for mounting device 33 to obtain a reply from management computer 15 (the applications or the like), whereby there is a possibility that a communication error is detected. Then, first confirmation processing section 41A determines whether management program PG is executed properly based on whether a reply to control command CMD is received from management computer 15 and the content of the reply. As a result, first confirmation processing section 41A can determine whether the communication error (the state where there is no reply) is occurring due to a disconnection of the communication path or the application stopping working.

(Fifth Advantageous Effect)

First confirmation processing section 41A is provided on at least one mounting device 33 of multiple mounting devices 33, determines a cause for a communication error in the communication path between management computer 15 and itself in response to an occurrence of a communication error in first network 18, and when confirming that there is no communication error, does not perform subsequent communication error confirmation processing (S15 in FIG. 4).

According to this, first confirmation processing section 41A is provided on at least one mounting device 33 of multiple mounting devices 33. With the communication path between management computer 15 and itself is normal, first confirmation processing section 41 does not execute a subsequent confirmation process. Due to this, for example, in the case where management computer 15 also includes a function of confirming abnormality in a communication path, management computer 15 can start a confirmation process in place of first confirmation processing section 41A. As a result, an appropriate confirmation process can be executed by management computer 15 configured to manage multiple mounting devices 33 through communication, that is, management computer 15 that communicates more generally over first network 18. In addition, a confirmation process can be prevented from being executed repeatedly by mounting device 33 and management computer 15, thereby making it possible to suppress the occurrence of a congested communication in association with execution of confirmation processes.

(Sixth Advantageous Effect)

Confirmation processing section 15D (the first confirmation processing section) is provided on management computer 15, transmits confirmation data D3 (third confirmation data) to all devices that are connected to first network 18 every predetermined period of time, and stores results of replies to third confirmation data D3 in such a state that a communication on first network 18 is normal. Confirmation processing section 15D retransmits third confirmation data D3 to all the devices that are connected to first network 18 in response to an occurrence of a communication error in first network 18, and compares results of replies to third confirmation data D3 at a normal case with those at an abnormal case to determine a cause for the communication error in the communication path (S16 in FIG. 4).

According to this, confirmation processing section 15D (the first confirmation processing section) transmits confirmation data D3 to all the devices on first network 18 and stores in advance the results of the replies at the normal case. Then, confirmation processing section 15D retransmits confirmation data D3 in response to an occurrence of a communication error and compares the results of the replies at the normal case with those at the abnormal case to confirm a communication error for the multiple communication paths collectively. As a result, confirmation processing section 15D can confirm in which communication path the communication error is occurring quickly.

(Seventh Advantageous Effect)

First confirmation processing section 41A is provided on at least one mounting device 33 of multiple mounting devices 33 and detects an amount of data that is transmitted and received between mounding device 33 that includes first confirmation processing section 41A and first network 18 in response to an occurrence of a communication error in the communication path connected to mounting device 33 that includes first confirmation processing section 41A to determine a cause for the communication error in the communication path connected to mounting device 33 that includes first confirmation processing section 41A based on the detection result (S21 in FIG. 5).

According to this, first confirmation processing section 41A detects an amount of data that is transmitted and received between first network 18 and mounting device 33 that includes first confirmation processing section 41A when a communication error occurs in the communication path connected to mounting device 33 that includes first confirmation processing section 41A. For example, when a congested communication occurs as a result of a large amount of data is transmitted from an arbitrary or any unit (for example, image processing board 47) within one mounting device 33, a communication error (a disconnection or delay of the communication) occurs in another unit (for example, main control section 41) sharing the communication path in the device. For example, when an amount of data transmitted and received is detected, determining that there is occurring no congested communication, first confirmation processing section 41A can notify (display) display device 42 of a possibility of occurrence of a communication error. In addition, first confirmation processing unit 41A can start a confirmation process of determining another cause (disconnection of LAN cable LN1 or the like) as the cause for the communication error.

On the other hand, when a congested communication is occurring, first confirmation processing section 41A can notify (display) display device 42 that there is found no abnormality in the communication path connected to mounting device 33 that includes first confirmation processing section 41A. First confirmation processing section 41A notifies, for example, a unit waiting to transmit data or the like of the results of the confirmation. This allows the unit waiting to transmit data to take an appropriate action of, for example, retransmitting the data after a certain period of time elapses, that is, a large amount of data is transmitted completely.

(Eighth Advantageous Effect)

in multiple mounting devices 33, setting data D2 relating to substrate work is transmitted from upstream mounting device 33 to downstream mounting device 33 in production line 13 where work is performed on substrate 11. First confirmation processing section 41A or confirmation processing section 15D determines a cause for the communication error in the communication path in response to an occurrence of abnormality in transmitting setting data D2.

According to this, in multiple mounting devices 33, setting data D2 relating to substrate work is transmitted from an upstream device to a downstream device. This allows downstream mounting device 33 to omit part of work (inspection work or the like) that overlaps the work of upstream mounting device 33 to thereby improve the work efficiency. In addition, first confirmation processing section 41A or confirmation processing section 15D determines a cause for a communication error at transmission of setting data D2, and when confirming that a communication error is occurring, first confirmation processing section 41A or confirmation processing section 15D can execute an appropriate countermeasure such as causing management computer 15 to transmit the setting data to all mounting devices 33 in place of upstream mounting device 33.

(Ninth Advantageous Effect)

Each of multiple mounting devices 33 is a mounting device configured to mount electronic component 12 (a component) on substrate 11 and includes main control section 41, a sub-control section (supply device 43, servo board 46, image processing board 47) connected with main control section 41 via communication lines 51A to 51C and configured to execute a process based on a control by main control section 41, and power supply section 48 configured to supply electric power to supply device 43 and the like. Supply device 43 and the like include external interfaces 52A to 52C configured to output a confirmation signal SI1 indicating whether electric power is supplied from power supply section 48. Main control section 41 includes second confirmation processing section 41B configured to confirm whether confirmation signal SI1 is output from external interfaces 52A to 52C in response to an occurrence of a communication error in communication lines 51A to 51C. Notification section (display device 42, display device 16C) notifies that a communication error occurs in communication lines 51A to 51C and a result of the confirmation by second confirmation processing section 41B.

According to this, second confirmation processing section 41B confirms an output of confirmation signal SI1 from external interfaces 52A to 52C in response to an occurrence of a communication error in communication lines 51A to 51C connecting main control section 41 with supply device 43 and the like. Display device 42 and the like notify the operator or the like of the results of the confirmation by second confirmation processing section 41B in addition to a message informing that a communication error is occurring in communication lines 51A to 51C. Thus, the operator or the like can confirm the content of the notification on display device 42 to confirm whether the communication error occurring is caused by a disconnection of communication lines 51A to 51C or the like or by the fact that electric power is not supplied to supply device 43 and the like (the sub-control section) originally or that the supply device 43 and the like are not switched on. Since the operator or the like can locate and grasp the abnormal part quickly, the time spent dealing with the communication error can be reduced.

6. Modified Examples

The present disclosure is not limited to the embodiment that has been described heretofore and hence can be carried out in various modified or improved forms based on the knowledge of those skilled in the art to which the present disclosure pertains.

For example, while mounting device 33 executes the process of confirming a communication error in the embodiment described above, the other substrate work devices (for example, substrate feeder 21) may execute the process of confirming a communication error.

While substrate work system 10 executes the various communication confirmation processes including S14, S16 (broadcast) in FIG. 4, S19 (management program PG), S21 (communication amount), and S24 (PING data D4) in FIG. 5, and the like, substrate work system 10 may be configured to execute at least one of these confirmation processes.

While first confirmation processing section 41A does not execute the subsequent confirmation process when the communication line between management computer 15 and itself is normal in the embodiment described above, first confirmation processing section 41 may continue to execute the subsequent confirmation process. In this case, management computer 15 may determine on a location where a communication error is occurring by comparing the results of the confirmation by itself (confirmation processing section 15D) with the results of the confirmation by first confirmation processing section 41A. While first confirmation processing section 41A of mounting device 33 (the substrate work device) confirms the communication amount of LAN interface 49 that same first confirmation processing section 41A includes in the embodiment described above, the configuration is not limited to this. For example, confirmation processing section 15D (first confirmation processing section) of management computer 15 may confirm a communication amount of communication circuit 15B in response to a communication error in management computer 15.

Supply device 43, servo board 46 and image processing board 47 may not include external interfaces 52A to 52C.

Management computer 15 may be a personal computer including a monitor, a key substrate and the like or a server including neither a monitor nor a key substrate.

REFERENCE SIGNS LIST

10: substrate work system; 11: substrate; 12: electronic component; 13: production line; 15: management computer (management device); 15D: confirmation processing section (first confirmation processing section); 16C: display device (notification section); 18: first network (network); 21: substrate feeder (substrate work device); 22: printer (substrate work device); 25: mounting work result inspection machine (substrate work device); 27: reflow furnace (substrate work device); 28: final inspection machine (substrate work device); 33: mounting device (substrate work device); 41: main control section; 41A first confirmation processing section; 41B: second confirmation processing section; 42: display device (notification section); 43: supply device (sub-control section); 46: servo board (sub-control section); 47: image processing board (sub-control section); 48: power supply section; 51A to 51C: communication line; 52A to 52C: external interface; CMD: control command (second confirmation data); D1: network configuration information; D2: setting data; D3: confirmation data (third confirmation data); D4: PING data (first confirmation data); PG: management program; SI1: confirmation signal.

The invention claimed is:

1. A substrate work system comprising:
   multiple substrate work devices connected to each other via a network and configured to perform work on a substrate;
   a management device connected to the multiple substrate work devices via the network and configured to manage the multiple substrate work devices;
   a first confirmation processing section provided on at least one device out of the multiple substrate work devices and the management device and configured to determine a cause for a communication error in a communication path connecting together at least two devices out of the multiple substrate work devices and the management device in response to an occurrence of a communication error in the network; and
   a notification section configured to notify an occurrence of a communication error in the network and a result of confirmation by the first confirmation processing section,
   wherein the first confirmation processing section is provided on at least one of the multiple substrate work devices, detects an amount of data transmitted and received between the network and the substrate work device including the first confirmation processing section in response to an occurrence of an communication error in the communication path connected to the substrate work device including the first confirmation processing section, and determines a cause for the communication error in the communication path connected to the substrate work device including the first confirmation processing section based on a result of the detection.

2. The substrate work system according to claim 1, wherein the first confirmation processing section determines the cause for the communication error in the communication path by making a confirmation communication between at least two devices out of the multiple substrate work devices and the management device.

3. The substrate work system according to claim 2, further comprising network configuration information necessary to specify a transmission destination for when data is transmitted to the multiple substrate work devices via the network,
wherein the first confirmation processing section transmits first confirmation data to at least one device out of the other substrate work devices and the management device based on the network configuration information in response to an occurrence of a communication error in the network, and determines the cause for the communication error in the communication path in accordance with a reply to the first confirmation data.

4. A substrate work system comprising:
multiple substrate work devices connected to each other via a network and configured to perform work on a substrate;
a management device connected to the multiple substrate work devices via the network and configured to manage the multiple substrate work devices;
a first confirmation processing section provided on at least one device out of the multiple substrate work devices and the management device and configured to determine a cause for a communication error in a communication path connecting together at least two devices out of the multiple substrate work devices and the management device in response to an occurrence of a communication error in the network; and
a notification section configured to notify an occurrence of a communication error in the network and a result of confirmation by the first confirmation processing section,
wherein the first confirmation processing section determines a cause for the communication error in the communication path by making a confirmation communication between at least two devices out of the multiple substrate work devices and the management device,
wherein the management device executes a management program for managing the multiple substrate work devices, and
wherein the first confirmation processing section is provided on at least one of the multiple substrate work devices, transmits second confirmation data for confirming whether the management program is executed properly to the management device in response to an occurrence of a communication error in the communication path between the management device and the first confirmation processing section, and determines a cause for the communication error in the communication path between the management device and the first confirmation processing section in accordance with a reply from the management device.

5. The substrate work system according to claim 2,
wherein the first confirmation processing section determines the cause for an communication error in the communication path between the management device and the first confirmation processing section in response to an occurrence of an communication error in the network, and when confirming that there is no communication error, does not execute subsequent communication error confirmation processing.

6. The substrate work system according to claim 1,
wherein the multiple substrate work devices transmits setting data relating to substrate work from an upstream substrate work device to a downstream substrate work device in a production line where work is performed on the substrate.

7. The substrate work system according to claim 1,
wherein each of the multiple substrate work devices is a mounting device configured to mount a component on the substrate and comprises a main control section, a sub-control section connected with the main control section via a communication line and configured to execute a process based on a control by the main control section, and a power supply section configured to supply electric power to the sub-control section,
wherein the sub-control section comprises an external interface configured to output a confirmation signal indicating whether electric power is supplied from the power supply section,
wherein the main control section comprises a second confirmation processing section configured to confirm whether the confirmation signal is output from the external interface in response to an occurrence of an communication error in the communication line, and
wherein the notification section notifies that an communication error occurs in the communication line and a result of the confirmation by the second confirmation processing section.

* * * * *